United States Patent [19]

Hansen et al.

[11] Patent Number: 5,053,716
[45] Date of Patent: Oct. 1, 1991

[54] DEVICE FOR CALIBRATING AND TESTING RING-SHAPED CURRENT CLAMPS

[75] Inventors: Diethard Hansen, Berikon; Dieter Köster, Turgi, both of Switzerland

[73] Assignee: ASEA Brown Boveri Ltd., Baden, Switzerland

[21] Appl. No.: 426,666

[22] Filed: Oct. 26, 1989

[30] Foreign Application Priority Data

Nov. 2, 1988 [CH] Switzerland .................. 4077/88

[51] Int. Cl.$^5$ .......................................... G01R 27/02
[52] U.S. Cl. .................................... 324/726; 324/601
[58] Field of Search .......... 324/726, 126, 127, 117 R, 324/601, 627

[56] References Cited

U.S. PATENT DOCUMENTS

| | | | |
|---|---|---|---|
| 3,359,488 | 12/1967 | Park | 324/726 |
| 4,281,284 | 7/1981 | Stutz et al. | 324/627 |
| 4,607,211 | 8/1986 | Eissmann | 324/726 |
| 4,810,954 | 3/1989 | Fam | 324/126 |

OTHER PUBLICATIONS

Eaton Corporation, Bulk Current Injection Probes and Broadband Power Amplifiers.
Siemens Components, vol. 20, No. 6, Dec. 1985 (Berlin, DE), pp. 237-240, H. A. Fritsche, "Measuring Methods for Testing the Screening Efficiency of Plug Connectors".
IEEE Transactions on Power Apparatus and Systems, vol. PAS-90, No. 1, Jan./Feb. 1971, pp. 318-324, T. Michael Sauders, "A Wide Range Current Comparator System for Calibrating Current Transformers".

Primary Examiner—Kenneth A. Wieder
Assistant Examiner—Maura K. Regan
Attorney, Agent, or Firm—Oblon, Spivak, McClelland, Maier & Neustadt

[57] ABSTRACT

A device for calibrating and testing ring-shaped current clamps comprises a calibration housing with an outer conductor enclosing the current clamp, and an inner conductor passing through the current clamp. The outer conductor encloses the current clamp on all sides and is adapted to the shape of the current clamp. The calibration housing also exhibits, with the current clamp accommodated therein, an impedance $Z_L$ which is predetermined by a measuring system. These measurement make it possible to measure the frequency response of the current clamp precisely, up into the GHz range. The calibration housing exhibits transitions which are conically tapered towards the connections (6, 7).

8 Claims, 1 Drawing Sheet

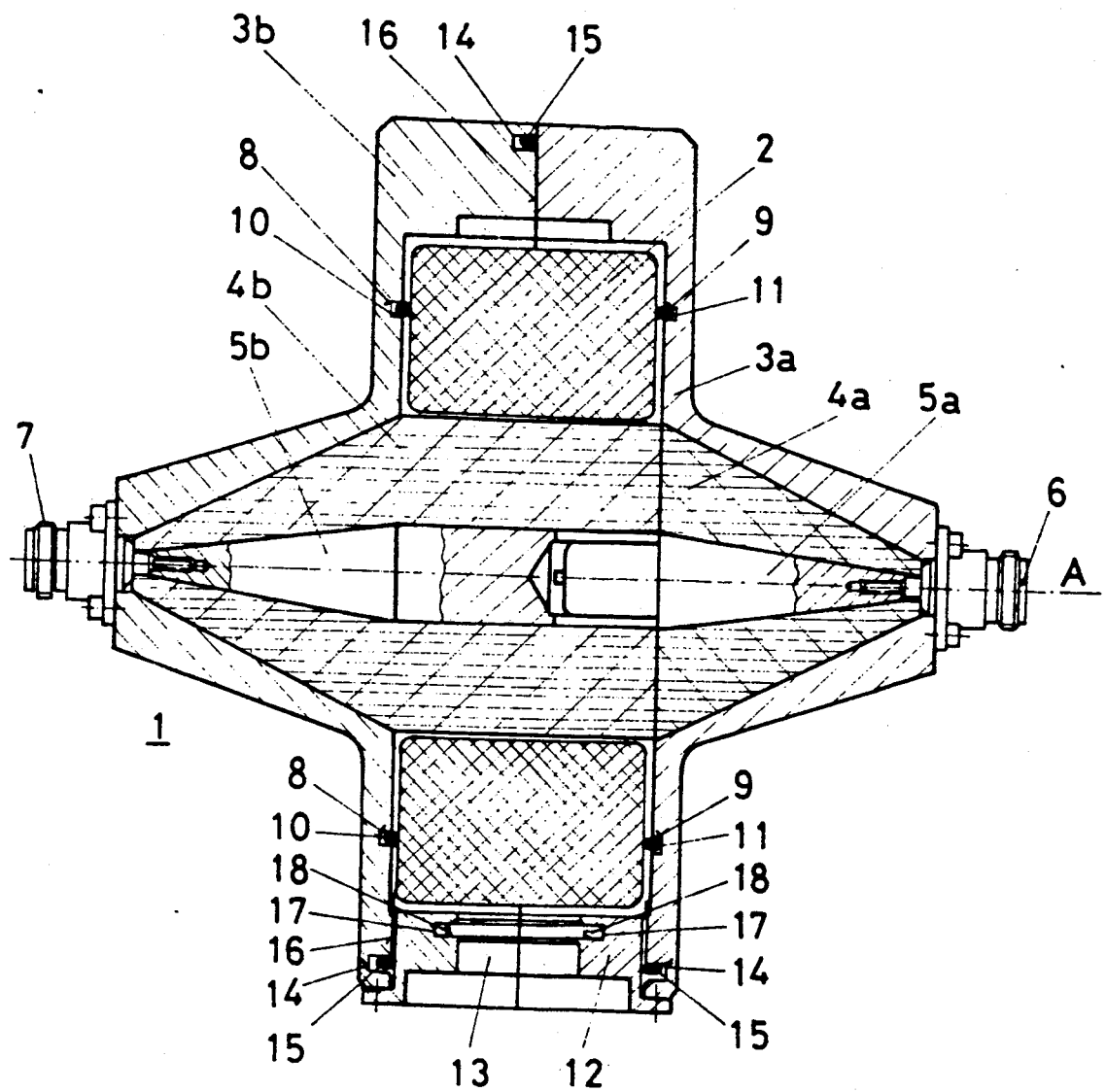

DEVICE FOR CALIBRATING AND TESTING RING-SHAPED CURRENT CLAMPS

BACKGROUND OF THE INVENTION

1. Field of the Invention

The invention relates to a device for calibrating and testing ring-shaped current clamps, comprising a calibration housing with an outer conductor enclosing the current clamp and an inner conductor passing through the current clamp.

2. Discussion of Background

Current clamps can be divided into measuring clamps and current injection clamps. Measuring clamps act as current transformers and current injection clamps as transformer with a secondary winding. They are mainly used in the fields of EMC, EMP, lightning testing, ESD and EMI control.

Current clamps are very sensitive to overloading. The inbuilt terminating resistors can be easily destroyed or, worse, damaged if the currents are too high. Damaged resistors cannot be easily detected and may falsify the measurements unnoticed.

From the point of view of quality control, it is therefore important to be able to measure the frequency response of such current clamps. For these purposes, the firm EATON CORPORATION, 5340 Alla Road, Los Angeles CA 90066, for example, offers a so-called calibration jig. This device essentially consists of an open housing and an inner conductor which is enclosed by the current clamp during testing. However, measurements have shown that this test device is unusable for higher frequencies from several hundred MHz to 1 GHz.

SUMMARY OF THE INVENTION

Accordingly, one object of this invention is to provide a novel device for calibrating and testing ring-shaped current clamps, comprising a calibration housing with an outer conductor enclosing the current clamp and an inner conductor passing through the current clamp, by means of which the frequency response can be precisely measured in the RF range.

According to the invention, the solution consists in that, in a device of the type initially mentioned, the outer conductor encloses the current clamp on all sides and is adapted to the shape of the current clamp and that the calibration housing with the current clamp accommodated therein exhibits an impedance which is predetermined by a measuring system.

The core of the invention lies in the fact that the current clamp to be tested is completely closed off from the outside world. The calibration housing with the current clamp accommodated therein has an impedance which matches the surrounding measuring device at any point. As a result, a measuring signal only senses the disturbance created by the current clamp. It is thus only due to the invention that it has become possible to measure the frequency response accurately up to 1 GHz. This results in advantages 1. for quality assurance,
2. for error correction in high-precision measurements,
3. for optimum utilization of the current clamps (that is to say up to the maximum individual loading limit) and
4. for the detection of damage.

Advantageous embodiments of the invention are found in the dependent patent claims.

BRIEF DESCRIPTION OF THE DRAWINGS

A more complete appreciation of the invention and many of the attendant advantages thereof will be readily obtained as the same becomes better understood, by reference to the following detailed description when considered in connection with the accompanying drawing, wherein the sole figure shows a longitudinal section of a calibration housing according to the invention with a current clamp accommodated therein.

DESCRIPTION OF THE PREFERRED EMBODIMENTS

Referring now to the drawing, the sole figure shows a longitudinal section through a calibration housing 1. According to a preferred embodiment, this consists of two halves which can be joined together in the axial direction. Correspondingly, certain electrical elements of the calibration housing 1 are assembled from two parts. In the figure, the parts belonging together in each case are designated by a and b placed behind the reference number.

The calibration housing 1 is mechanically adapted to the constructional shape of a type of current clamp 2 to be tested.

The current clamp is not part of the invention but, for example, a commercially available measuring clamp for radio frequency applications. It is ring-shaped and has, for example, a hinge and a closing mechanism so that it can be placed around an electric conductor in the form of a clamp. On the outside a connection is mounted, for example a standard socket.

The calibration housing 1 comprises an outer conductor 3a, 3b, an insulator 4a, 4b and an inner conductor 5a, 5b. It is approximately rotationally symmetrical with respect to an axis A. On this axis A, two connections 6 and 7 are provided in each case at opposite ends of the calibration housing 1.

The outer conductor 3a, 3b completely encloses the current clamp 2. It is also adapted to the external shape of the latter. The inner conductor 5a, 5b is passed through the current clamp 2. The insulator 4b is arranged between inner conductor 5b and current clamp 2. Inner conductor 5b and insulator 4b are cylindrical inside the current clamp 2. The insulator 4b has an outside diameter D which precisely corresponds to the inside diameter of the current clamp, an inside diameter d which precisely corresponds to the diameter of the inner conductor 5b, and a dielectric constant $\epsilon$. These three variables satisfy the following relation:

$$Z_L = \frac{60}{\sqrt{\epsilon_r}} \ln \frac{D}{d} \qquad (I)$$

$Z_L$ is an impedance which is predetermined by a measuring system (for example $Z1 = 50$ ohms).

The insulator 4a, 4b centers the inner conductor 5a, 5b with respect to the ring-shaped current clamp 2. It should consist of a material which is sufficiently solid. So that the inside diameter d and, in consequence, the inner conductor 5a, 5b is as small as possible, the dielectric constant $\epsilon_r$ is preferably selected to be of the order of magnitude of one. Teflon is advantageous in this respect, as are "foam-like" materials, that is to say materials containing a large volume of air, such as expanded polystyrene.

The two axially arranged connections 6 and 7 are, for example, standard connectors for coaxial cables. In general, the inside diameter of the current clamp 2 and the diameter of the inner conductor 5a, 5b are therefore greater than the corresponding dimensions of the standard connector. According to the invention, a transition is provided for each connection 6, 7 in this case. In this transition, inner and outer conductors are in each case conically tapered from the axial area of the current clamp 2 towards the connections 6, 7 along a length L. The important factor in this is that the relation (I) is maintained at every point of the transition. (The maximum outside diameter D is then replaced by a local outside diameter in the formula (I). This correspondingly applies to the inside diameter d.)

The smaller the angle of inclination, that is to say the ratio between outside diameter D and length L, the better the transition and the lower the effect of mechanical inaccuracies of the components. On the other hand, it is desirable for economic reasons to keep the calibration housing as small as possible. It has been found that it is advantageous to select the length L to be of approximately the same size as the outside diameter D. The length L is preferably at least as large as the maximum outside diameter D.

The current clamp 2 must be electrically insulated from the outer conductor 3a, 3b. At the same time, it should be mechanically well fixed in place. According to a preferred embodiment of the invention, this is achieved in such a manner that each half of the outer conductor 3a and 3b, respectively, exhibits an annular slot 8 and 9, respectively, into which an elastic O ring 10 and 11, respectively, is inserted. The outer conductor 3a, 3b comes into contact with the current clamp 2 at exactly one place, namely at its connection 13. The electrical contact is secured by a slot 17 and an elastic band 18 around which wire is wound and which is inserted therein.

For the connection 13 of the current clamp 2 mentioned at the beginning, a mounting plate 12 is inserted at the outer conductor 3a, 3b.

The two halves of the calibration housing must be joined to one another in such a manner that proper electric contact is ensured. In the case of the inner conductor 5a, 5b, this is achieved most simply by means of a plug-in contact In the case of the outer conductor 3a, 3b, one of the halves is preferably provided at one contact face 16 with a continuous slot 14 into which an elastic band 15, around which wire is wound (for example a rubber ring around which a wire mesh is wound, called a gasket) is inserted.

If the calibration housing is fabricated of aluminum according to an advantageous embodiment, the contact face is also covered with a layer of good conductivity (for example of silver).

Naturally, the calibration housing according to the invention has dimensions which are different depending on the constructional shape of the current clamp to be tested. In the case of small current clamps, the conical transition may be omitted, depending on circumstances.

It is not so important that the calibration housing consists of two halves which can be joined together axially. In practice, attention must simply be paid to the fact that the measures which allow the housing to be taken apart do not induce any disturbances in the impedance and no inadmissible wave modes are propagated in the test device.

It can finally be said that the invention creates a mechanically simple device by means of which current clamps can also be electrically qualified in the RF range.

Obviously, numerous modifications and variations of the present invention are possible in light of the above teachings. It is therefore to be understood that, within the scope of the appended claims, the invention may be practiced otherwise than as specifically described herein.

What is claimed as new and desired to be secured by Letters Patent of the United States is:

1. A calibration housing for calibrating ring-shaped current clamps, comprising:
   (a) an outer conductor enclosing the current clamp; and
   (b) an inner conductor passing through the current clamp; wherein:
   (c) the outer conductor encloses the current clamp on all sides and is adapted to the shape of the current clamp;
   (d) the calibration housing with the current clamp accomodated therein exhibits an impedance $Z_L$ which is predetermined by a measuring system;
   (e) an insulator which centers the inner conductor with respect to the current clamp is arranged between the inner conductor and the current clamp; and
   (f) an inside diameter d, an outside diameter D and a dielectric constant $\epsilon_r$ of the insulator satisfy the following relation:

$$Z_L = \frac{60}{\sqrt{\epsilon_r}} \ln(D/d)$$

wherein $Z_L$ designates the given impedance of the system.

2. A calibration housing as claimed in claim 1, wherein:
   (a) the calibration housing exhibits two axially arranged connections; and
   (b) the inner conductor and outer conductor of the calibration housing are conically tapered in the axial direction towards the connections along a length L.

3. A calibration housing as claimed in claim 2, wherein the length L is at least as large as the maximum outside diameter D of the insulator.

4. A calibration housing as claimed in claim 1, wherein the dielectric constant $\epsilon_r$ of the insulator is of the order of magnitude of one.

5. A calibration housing as claimed in claim 1, wherein the calibration housing consists of two form-locking halves with one contact face each, which can be jointed to one another in the axial direction.

6. A calibration housing as claimed in claim 5, wherein the current clamp is fixed in place by the outer conductor by means of insulating eleastic O rings, and the outer conductor only comes into contact with the current clamp at its connection.

7. A calibration housing as claimed in claim 5, wherein the outer conductor consists of aluminum and the insulator consists of Teflon or expanded polystyrene.

8. A calibration housing as claimed in claim 5, wherein, in order to improve the electric contact between two halves, a continuous slot is provided on one contact face into which an elastic band is placed around which wire it wound.

* * *